(12) United States Patent
Kim et al.

(10) Patent No.: US 8,988,640 B2
(45) Date of Patent: Mar. 24, 2015

(54) DISPLAY DEVICE AND FABRICATION METHOD OF THE SAME

(75) Inventors: Hyun-Young Kim, Yongin (KR); Joo-Sun Yoon, Yongin (KR); Jin-Yup Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 947 days.

(21) Appl. No.: 13/019,876

(22) Filed: Feb. 2, 2011

(65) Prior Publication Data

US 2011/0255044 A1 Oct. 20, 2011

(30) Foreign Application Priority Data

Apr. 16, 2010 (KR) .................. 10-2010-0035248

(51) Int. Cl.
| | | |
|---|---|---|
| G02F 1/1333 | (2006.01) | |
| G02F 1/136 | (2006.01) | |
| H01L 29/49 | (2006.01) | |
| G02F 1/1368 | (2006.01) | |
| H01L 29/423 | (2006.01) | |
| H01L 27/12 | (2006.01) | |

(52) U.S. Cl.
CPC .......... *H01L 29/4908* (2013.01); *G02F 1/1368* (2013.01); *H01L 29/42384* (2013.01); *H01L 27/1255* (2013.01)
USPC ............................................ 349/138; 349/43

(58) Field of Classification Search
CPC ................................................. G02F 1/133345
USPC ......................................................... 349/138
See application file for complete search history.

(56) References Cited

U.S. PATENT DOCUMENTS

| | | | |
|---|---|---|---|
| 5,610,082 A | * | 3/1997 | Oh ................................. 438/160 |
| 2006/0273316 A1 | | 12/2006 | Yang et al. |
| 2008/0013026 A1 | | 1/2008 | Choi et al. |
| 2008/0017862 A1 | * | 1/2008 | Lee et al. ......................... 257/59 |
| 2009/0026453 A1 | * | 1/2009 | Yamazaki ........................ 257/59 |

(Continued)

FOREIGN PATENT DOCUMENTS

| | | |
|---|---|---|
| JP | 04-056168 | 2/1992 |
| JP | 2005-064032 | 3/2005 |
| JP | 2006-338008 | 12/2006 |

(Continued)

OTHER PUBLICATIONS

Korean Office Action in Korean priority Patent Application No. 10-2010-0035248 dated Jun. 20, 2011.

(Continued)

*Primary Examiner* — Charles Chang
(74) *Attorney, Agent, or Firm* — Knobbe Martens Olson & Bear LLP

(57) ABSTRACT

The embodiment relates to a display device having an improved aperture ratio and capacitance, and a fabrication method of the display device, in which the display device may include a thin film transistor, which includes: an active layer, a gate electrode, a source electrode electrically connected to the active layer, a drain electrode electrically connected to the active layer, and a gate insulating material formed between the active layer and the gate electrode, where the gate insulating material includes a first layer, a second layer and a third layer, where the second layer has a thickness between about 0.1 to about 1.5 times a thickness of the first layer, and where the third layer has a thickness between about 2 to about 12 times the thickness of the second layer.

23 Claims, 10 Drawing Sheets

(56) References Cited

U.S. PATENT DOCUMENTS

2010/0059744 A1* 3/2010 Yin et al. .................. 257/43
2011/0097857 A1 4/2011 Jung et al.

FOREIGN PATENT DOCUMENTS

| KR | 100124976 B1 | 10/1997 |
| KR | 1020060114757 | 11/2006 |
| KR | 1020060125066 | 12/2006 |
| KR | 1020070102776 A | 10/2007 |
| KR | 1020070105925 | 10/2007 |
| KR | 1020070109192 | 11/2007 |
| KR | 1020080067852 A | 7/2008 |
| KR | 10-2008-0095956 | 10/2008 |
| TW | 200811568 | 1/2008 |

OTHER PUBLICATIONS

Office Action dated Jan. 2, 2012 in Korean priority application No. 10-2010-0035248.

Office Action dated Oct. 2, 2012 in corresponding Japanese Patent Application No. 2010-180327.

Office Action dated Aug. 20, 2014 for Taiwan patent application No. 100107582 claiming priority to the Korean priority application No. 10-2010-0035248.

* cited by examiner

DISPLAY DEVICE AND FABRICATION METHOD OF THE SAME

CROSS-REFERENCE TO RELATED APPLICATIONS

This application claims priority to and the benefit of Korean Patent Application No. 10-2010-0035248, filed on Apr. 16, 2010, in the Korean Intellectual Property Office, the entire content of which is incorporated herein by reference.

BACKGROUND

1. Field

This disclosure relates to a display device, such as a liquid crystal display device and an organic light emitting display device, and a fabrication method of the display device.

2. Description of the Related Technology

Embodiments of the present invention relate to a display device and a fabrication method of the same. In more detail, embodiments of the present invention relate to a display device that can implement a plane image, such as a liquid crystal display device and an organic light emitting display device, and a fabrication method of the display device.

SUMMARY OF CERTAIN INVENTIVE ASPECTS

Embodiments of the present invention provide a display device that improves an aperture ratio and capacitance, and a fabrication method of the display device.

One aspect is a display device including a thin film transistor, which includes: an active layer, a gate electrode, a source electrode electrically connected to the active layer, a drain electrode electrically connected to the active layer, and a gate insulating material formed between the active layer and the gate electrode, where the gate insulating material includes a first layer, a second layer and a third layer, where the second layer has a thickness between about 0.1 to about 1.5 times a thickness of the first layer, and where the third layer has a thickness between about 2 to about 12 times the thickness of the second layer.

The etching selectivity between the third layer and the second layer may be about 1:20 to about 1:8, and the etching selectivity between the second layer and the first layer may be about 1:20 to about 1:8.

The first layer and the second layer may be formed of different materials than one another such that a response to an etchant is faster for the second layer than the first layer.

The second layer and the third layer may be formed of different materials than one another such that a response to an etchant is faster for the third layer than the second layer.

The third layer and the first layer may each include silicon nitride, and the second layer may include silicon oxide.

At least any one of the source electrode and the drain electrode may contact the second layer.

At least any one of the source electrode and the drain electrode may contact the first layer.

The active layer and the third layer may have the same side etched surface.

The active layer, the third layer, and the second layer may have the same side etched surface.

The display device may further include a capacitor, which may include: a first electrode, a second electrode, and a dielectric material positioned between the first electrode and the second electrode.

The first electrode and the gate electrode may be formed of the same material and from the same processing.

The second electrode, the source electrode and the drain electrode may be formed of the same material and from the same processing.

The first layer and the second layer of the gate insulating material may extend to the capacitor to provide the dielectric material.

The dielectric material may include only one layer, and the first layer of the gate insulating material may extend to the capacitor to provide the dielectric material.

The first, the second and the third layers of the gate insulating material, and the active layer may extend to the capacitor to provide the dielectric material.

The capacitor may further include: a first transparent conductive layer connected with the first electrode, and a second transparent conductive layer connected with the second electrode.

Another aspect is a display device, including: a thin film transistor positioned over a substrate, and a capacitor positioned over the substrate, where the thin film transistor includes: an active layer, a gate electrode, a source electrode electrically connected to the active layer, a drain electrode electrically connected to the active layer, and a gate insulating material formed between the active layer and the gate electrode, where the gate insulating material includes a first layer, a second layer and a third layer, where the capacitor includes: a first electrode, a second electrode, and a dielectric material positioned between the first electrode and the second electrode, where the dielectric material includes less layers than the gate insulating material.

The dielectric material may include the active layer and the third layer.

The dielectric material may include the active layer, the third layer, and the second layer.

The second layer may have a thickness between about 0.1 to about 1.5 times a thickness of the first layer, and the third layer may have a thickness between about 2 to about 12 times the thickness of the second layer.

BRIEF DESCRIPTION OF THE DRAWINGS

The accompanying drawings, together with the specification illustrate certain exemplary embodiments.

DETAILED DESCRIPTION OF CERTAIN INVENTIVE EMBODIMENTS

Figure 1:
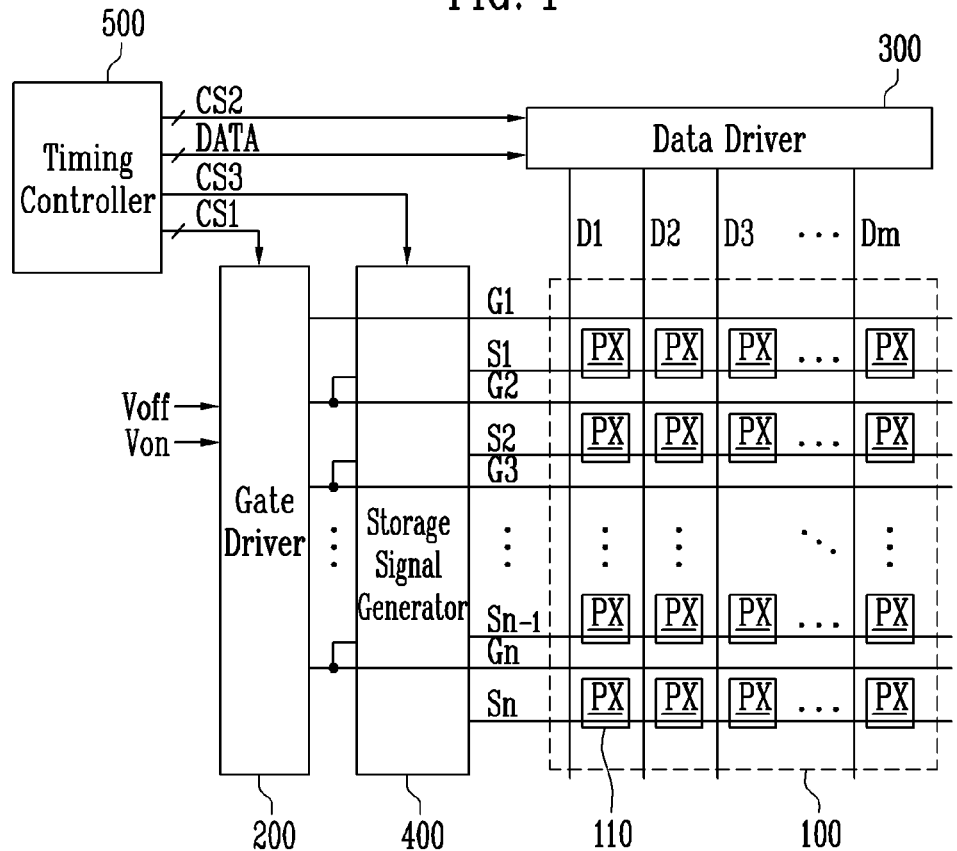
FIG. 1 is a block diagram illustrating one embodiment of a display device.

In the following detailed description, certain exemplary embodiments are described, simply by way of illustration. As those skilled in the art would realize, the described embodiments may be modified in various ways, without departing from the spirit or scope of the present invention. Accordingly, the drawings and description are to be regarded as illustrative in nature and not restrictive. In addition, when an element is referred to as being "on" another element, it can be directly on the other element or be indirectly on the other element with one or more intervening elements interposed therebetween. When an element is referred to as being "connected to" another element, it can be directly connected to the other element or be indirectly connected to the other element with one or more intervening elements interposed therebetween. Hereinafter, like reference numerals generally refer to like elements.

Embodiments of a Display Device

Figure 2:
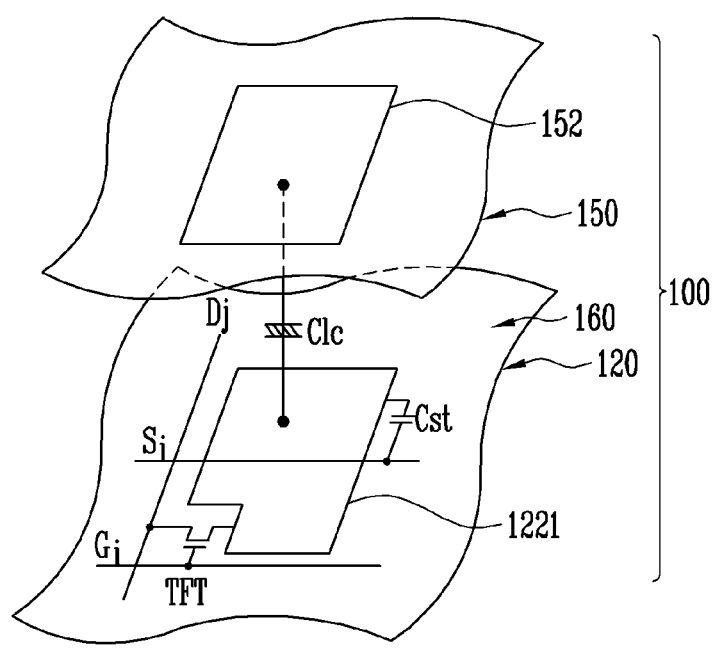
FIG. 2 is an embodiment of an equivalent circuit diagram of a pixel shown in FIG. 1.

FIG. 1 is a block diagram illustrating one embodiment of a display device. FIG. 2 is an embodiment of an equivalent circuit diagram of a pixel shown in FIG. 1.

Referring to FIG. 1, an embodiment of a display device includes: a plurality of signal lines, a pixel unit 100, a gate driver 200, a data driver 300, a storage signal generator 400, and timing controller 500.

The signal lines may include data lines D1-Dm, gate lines G1-Gn, and storage lines S1-Sn. The pixel unit 100 may include a plurality of pixels 110 (PX). The gate driver applies a gate signal to each of the gate lines G1-Gn. The storage signal generator 400 applies a storage signal to each of the storage lines S1-Sn. The timing control unit 500 controls the gate driver 200, the data driver 300, and the storage signal generator 400.

The timing controller 500 applies control signals CS1, CS2, and CS3, respectively, to control the gate driver 200, the data driver 300, and the storage signal generator 400. And the timing controller 500 also applies a data signal DATA to the data driver 300.

Referring to FIG. 2, the pixel unit 100 includes first substrate 120 and second substrate 150, the substrates facing each other, and a liquid crystal layer 160 positioned between the first and second substrates 120 and 150. The data lines D1-Dm, gate lines G1-Gn, and storage lines S1-Sn may be disposed on the first substrate.

The gate lines G1-Gn transmit gate signals. The storage lines S1-Sn are disposed alternately with the gate lines G1-Gn and transmit storage signals. The data lines transmit data voltage.

Referring to FIG. 1, the gate lines G1-Gn and the storage lines S1-Sn may be arranged in a first direction. The data lines D1-Dm may be arranged in a second direction crossing the first direction.

Each of the pixels 110 may be connected with data lines D1-Dm, gate lines G1-Gn, and storage lines S1-Sn. The pixels 110 may be arranged in a matrix.

Referring to FIG. 1, for example, the pixel Px connected with the i-th gate line Gi and the j-th data line Dj may include a thin film transistor TFT connected to the gate line Gi and the data line Dj, a liquid crystal capacitor Clc connected to the thin film transistor TFT, and a storage capacitor Cst connected to the thin film transistor TFT and the i-th storage line Si.

Referring to FIG. 2, the gate electrode of the thin film transistor TFT may be connected to the gate line Gi, the source electrode may be connected to the data line Dj, and the drain electrode may be connected to the liquid crystal capacitor Clc and the storage capacitor Cst.

The liquid crystal capacitor Clc may include a pixel electrode 1221 of the first substrate 120, a common electrode 152 of the second substrate 150, and the liquid crystal layer 160. The pixel electrode 1221 and the common electrode 152 may respectively be used as the lower electrode and the upper electrode of the liquid crystal capacitor Clc. The liquid crystal layer 160 disposed between the pixel electrode 1221 and the common electrode 152 may be used as a dielectric material of the liquid crystal capacitor Clc.

The pixel electrode 1221 may be connected with the thin film transistor TFT. The common electrode 152 may be disposed on the front surface of the second substrate 150. Common voltage Vcom (not shown) may be applied to the common electrode 152. In some embodiments, the common voltage Vcom may be a DC voltage having a predetermined magnitude.

In some embodiments, the common electrode 152 may be disposed on the first substrate 120. In such embodiments, at least one of the pixel electrode 1221 and the common electrode 152 may have a linear or rod shape.

The storage capacitor Cst may include a first electrode, a second electrode facing the first electrode, and a dielectric material disposed between the first electrode and the second electrode. In some embodiments, the first electrode or the second electrode may be the storage lines S1-Sn. In other embodiments, the first electrode or the second electrode may be electrically connected with the storage lines S1-Sn.

The gate driver 200 sequentially applies gate signals formed of a combination of gate-on voltage Von (not shown) and gate-off voltage Voff (not shown) to the gate lines G1-Gn connected to the gate driver 200.

The storage signal generator 400 may be disposed close to the gate driver 200. The storage signal generator 400 generates high-level or low-level storage signals in response to gate signals from the gate driver 200 and applies the signals to the storage lines arranged in the pixel unit 100.

Figure 3:
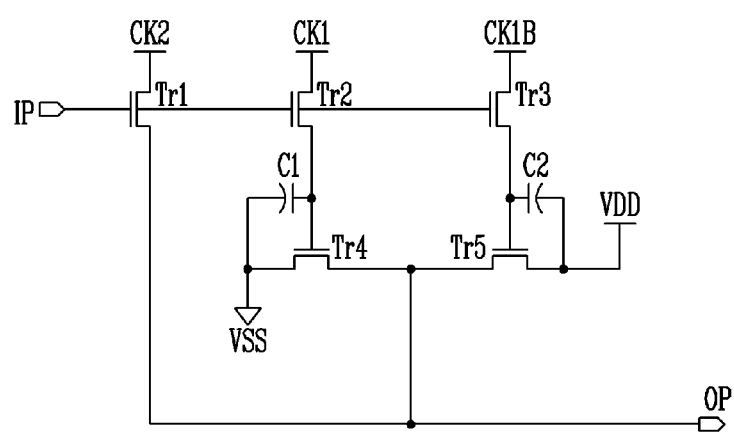
FIG. 3 is a circuit diagram of an embodiment of the storage signal generator shown in FIG. 1.

FIG. 3 is a circuit diagram of an embodiment of the storage signal generator shown in FIG. 1.

Referring to FIG. 3, an input terminal IP is connected with the i+1-th gate line Gi+1 and receives a gate signal to generate the i-th storage signal. Further, an output terminal OP is connected with the i-th storage line Si and outputs the i-th storage signal.

The storage signal generator 400 receives first and second clock signals CK1 and CK1B and a boost signal CK2, which are signals associated with the control signal CS3 from the timing controller 500. Further, the storage signal generator 400 receives power from a high-level source, VDD, and power from a low-level source, VSS, from the timing controller 500, or from outside the display device. One embodiment of the storage signal generator 400 may include five thin film transistors Tr1, Tr2, Tr3, Tr4, and Tr5 and two capacitors C1 and C2.

The gate electrode, source electrode, and drain electrode of the first thin film transistor Tr1 are connected with the input terminal and the boost signal CK2 and may be connected with the output terminal OP. The gate electrodes of the second and third thin film transistors Tr2 and Tr3 may be connected with the input terminal IP and the first and second clock signals CK1 and CK1B. The source electrodes of the second and third thin film transistors Tr2 and Tr3 may be connected with the first and second clock signals CK1 and CK1B, respectively.

The gate electrodes of the fourth and fifth thin film transistors Tr4 and Tr5 may be connected with the drain electrodes of the second and third thin film transistors Tr2 and Tr3. The source electrodes of the fourth and fifth thin film transistors Tr4 and Tr5 may be connected with VSS and VDD. The drain electrodes of the fourth and fifth thin film transistors Tr4 and Tr5 may be connected with the output terminal OP. The first and second capacitors C1 and C2 may be connected between the gate electrodes of the fourth and fifth thin film transistors Tr4 and Tr5 and VSS and VDD.

As shown in the embodiment of FIGS. 1 to 3, the display device includes a thin film transistor and a capacitor in each pixel, and in the storage signal generator.

The capacitor provided in the pixel, as described above, may operate as the storage capacitor Cst. The storage capacitor is generally of small capacitance to keep the data signal stable and implement high resolution.

It is possible to increase the area of the storage capacitor Cst to increase the capacitance of the storage capacitor. However, when increasing the area of the storage capacitor, the aperture ratio may be reduced. Alternatively, it is possible to increase the capacitance of the storage capacitor Cst by reducing the thickness of the dielectric material between the electrodes of the storage capacitor Cst. However, the gate insulating material of the thin film transistor TFT would decrease in thickness, such that the parasitic capacitance between the gate electrode, source and drain electrodes would increases, and the driving characteristics may be reduced.

Embodiments of the display device may improve capacitance of the storage capacitor Cst while increasing the insulation effect of the thin film transistor TFT by making the thickness of the gate dielectric material in the region where the thin film transistor TFT is formed, and the thickness of the dielectric material where the storage capacitor Cst is formed different from one other.

The thin film transistor TFT and the storage capacitor Stare positioned in the pixel unit 100 and the storage signal generator 400 and may be formed on the first substrate 120 by the same process. Therefore, thin film transistor TFT and the storage capacitor Cst may be provided not only the pixel unit 100, but also in the peripheral circuit regions, including the storage signal generator 400.

In the embodiments described below, only the region of the first substrate 120 where the thin film transistor TFT and the storage capacitor Cst are formed is described for convenience. The peripheral circuit regions would exhibit the same features.

Figure 4:
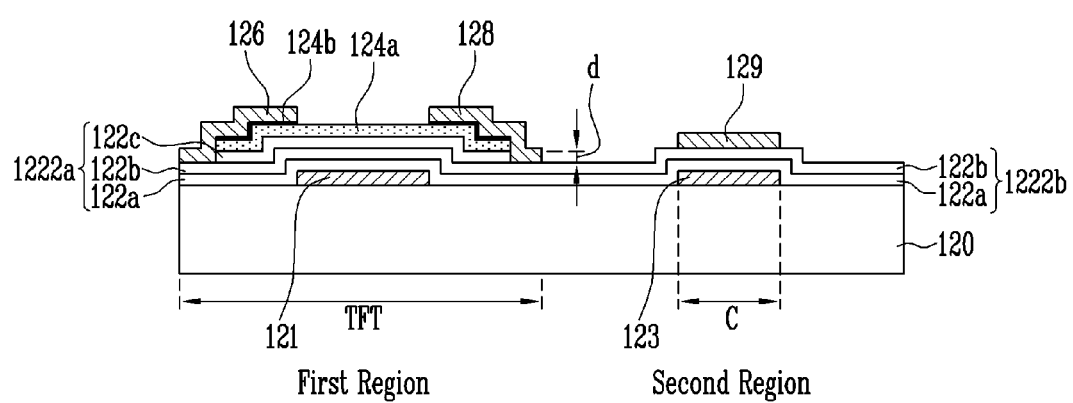
FIG. 4 is a cross-sectional view of an embodiment of a display device.

FIG. 4 is a cross-sectional view of an embodiment of a display device. Referring to FIG. 4, one embodiment of the display device includes a first substrate 120, a thin film transistor TFT positioned in the first region, and a capacitor C positioned in the second region, both on the first substrate 120.

The thin film transistor TFT includes a gate electrode 121 formed on the first substrate 120, a gate insulating material 1222a formed on the gate electrode 121, an active layer 124a formed on the gate insulating material 1222a, and a source electrode 126 and a drain electrode 128 formed on the active layer 124a. In some embodiments, a resistive contact layer 124b may be disposed between the source and drain electrodes 126 and 128 and the active layer 124a.

The gate electrode 121 is electrically connected with a gate line (not shown). The gate electrode 121 receives a gate signal through the gate line.

The gate insulating material 1222a is formed by sequentially stacking first to third insulating layers 122a, 122b, and 122c on the gate electrode 121.

The third insulating layer 122c and the second insulating layer 122b may include insulating materials having different etching selectivities. In one embodiment, the second insulating layer 122b may be used as an anti-etching layer in the etching process of the third insulating layer 122c. Therefore, in the etching process of the third insulating layer 122c, it is possible to protect the components under the second insulating layer 122b and sufficiently etch the third insulating layer 122c.

In one embodiment, the first and third insulating layers 122a and 122c may include silicon nitride SiNx and the second insulating layer 122b may include silicon oxide. In this configuration, the etching selectivity of the second insulating layer 122b and the third insulating layer 122c are about 1:20 and about 1:8, respectively, which are relatively high. Therefore, the second insulating layer 122b can sufficiently function as the anti-etching layer in the etching process of the third insulating layer 122c.

In general, silicon oxide is higher in BV (Break Voltage, unit: MV/cm), which is a value representing an insulation characteristic, than the silicon nitride. Further, the silicon oxide has better surface roughness or surface uniformity than the silicon nitride. However, it is difficult to achieve thick silicon oxide and the dielectric constant of the silicon oxide is lower than the silicon nitride. Further, since the silicon nitride film is formed by using a silane ($SiH_4$) gas containing hydrogen, the surface roughness or the surface uniformity is lower than the silicon oxide film.

The gate insulating material 1222a is formed on the gate electrode 121 and electrically connects the gate electrode 121 with the source and drain electrodes 126 and 128. In one embodiment, it is possible to ensure sufficient insulating characteristic, because the gate insulating material 1222a has the second insulating layer 122b including the silicon oxide.

With the ratio T2/T1 of the thickness of the second insulating layer 122b to the thickness T1 of the first insulating layer 122a being less than about 0.1, the thickness of the second insulating layer 122b is relatively small, such that thickness uniformity of the second insulating layer 122b that is formed by chemical vapor deposition and the break down voltage characteristics of the layer are reduced. On the other hand, with the ratio T2/T1 of the thickness T2 of the second insulating layer 122b to the thickness T1 of the first insulating layer 122a including the silicon oxide being above about 1.5, the thickness T1 of the first insulating layer 122a is relatively high, such that it is difficult to sufficiently increase the capacitance that can be increased by using nitride.

With the ratio T3/T2 of the thickness T3 of the third insulating layer 122c to the thickness T2 of the second insulating layer 122b being less than about 2, the thickness T2 of the second insulating layer 122b including the silicon oxide is relatively small, such that it is impossible to ensure desired break down voltage characteristics. On the other hand, with the ratio T3/T2 of the thickness T3 of the third insulating layer 122c to the thickness T2 of the second insulating layer 122b being above about 12, the thickness T3 of the third insulating layer is relatively high, sensitivity to the voltage applied to the gate electrode 121 of the thin film transistor TFT decreases and it is very difficult to effectively cover the steps where the source electrode 126 and the drain electrode 128 are formed between the second insulating layer 122b and the third insulating layer 122c.

In some embodiments, the ratio T2/T1 of the thickness T2 of the second insulating layer 122b to the thickness T1 of the first insulating layer 122a may be about 0.1 to about 1.5, and the ratio T3/T2 of the thickness T3 of the third insulating layer 122c to the thickness T2 of the second insulating layer 122b may be about 2 to about 12.

In one embodiment, the thicknesses T1, T2, and T3 of the first insulating layer 122a, the second insulating layer 122b, and the third insulating layer 122c may be about 400 Å, about 400 Å, and about 2000 Å, respectively. In another embodiment, the thickness T1 of the first insulating layer 122a may be between about 800 Å to about 1000 Å, and the thickness T2 of the second insulating layer 122b and the thickness T3 of the third insulating layer 122c may be about 200 Å and about 2000 Å, respectively.

Still referring to FIG. 4, the active layer 124a may have a channel region between the source electrode 126 and the drain electrode 128. The resistive contact layer 124b may be positioned between the active layer 124a and the source electrode 126 and between the active layer 124a and the drain electrode 128. The resistive contact layer reduces contact resistance that may be generated by the active layer 124a, which may include amorphous silicon, and by the source electrode 126 and the drain electrode 128, which may include metal. In some embodiments, the active layer 124a may include amorphous silicon a-Si without being doped with a dopant. In some embodiments, the resistive contact layer 124b may include amorphous silicon doped with an N-type or P-type dopant. The active layer 124a supplies predetermined voltage, which is supplied to the source electrode 126 when a gate signal is supplied to the gate electrode 121, to the drain electrode 128.

The gate electrode 121 corresponds to the channel region of the active layer 124a, at a predetermined distance. As shown in FIG. 4, with at least one of the source and drain electrodes 126 and 128 directly contacting the second insulating layer 122b at the outside of the active layer 124a, the distance between the source and drain electrodes 126 and 128 and the gate electrode 121 decreases as much as the thicknesses of the active layer 124a and the resistive contact layer 124b. Therefore, the parasitic capacitance between the source and drain electrodes 126 and 128 and the gate electrode 121, which is in inverse proportion to the distance, increases. In some embodiments, since the first insulating layer 122a and the second insulating layer 122c having relatively high dielectric constants are used, the increase of the parasitic capacitance may be relatively high.

With at least one of the source and drain electrodes 126 and 128 contacting the second insulating layer 122b, the source and drain electrodes 126 and 128 should cover the step as much as at least the thicknesses of the active layer 124a and the resistive layer 124b, such that a short may be caused by separation of the source and drain electrodes 126 and 128, or byproducts of the source and drain electrodes 126 and 128.

In some embodiments, it is possible to prevent the parasitic capacitance from increasing between the source and drain electrodes 126 and 128 and the gate electrode 121, by positioning the source and drain electrodes 126 and 128 only above the active layer 124a, that is, the region where they overlap the active layer 124a and the resistive contact layer 124b. In such embodiments, the first to third insulating layers 122a, 122b, and 122c, the active layer 124a, and the resistive layer 124b are positioned between the gate electrode 121 and the source and drain electrodes 126 and 128. Such embodiments reduce influence on the parasitic capacitance by the gate electrode 121 and the source and drain electrodes 126 and 128. In other embodiments, it is possible to remove problems caused by covering the step with the source and drain electrodes 126 and 128.

In some embodiments, it is possible to form the same thin film transistor and capacitor in the peripheral circuit regions, such as the storage signal generator, by substantially the same process.

In the capacitor C formed in the second region, the first electrode 123 and the second electrode 129 overlap each other, with the dielectric material 1222b therebetween.

The first electrode 123 may include substantially the same material as the gate electrode 121 of the thin film transistor TFT. The first electrode 123 may be positioned on the same layer as the gate electrode 121 of the thin film transistor TFT. In some embodiments, the first electrode 123 and the gate electrode 121 may be deposited and patterned on a base structure including at least one or more layers by the same deposition process.

The second electrode 129 may include the same material as the source and drain electrodes 126 and 128 of the thin film transistor TFT. The second electrode 129 may be positioned on the same layer as the source and drain electrodes 126 and 128 of the thin film transistor TFT. The second electrode 129 may be electrically connected with the drain electrode 128 of the thin film transistor TFT.

With the capacitor C implemented by the storage capacitor Cst provided in the pixel, the first electrode 123 may be integrally formed with the storage line (not shown) arranged in parallel with the gate line (not shown) in the first direction. In other embodiments, the capacitor C may be electrically connected with the storage line. Therefore, a storage signal supplied to the storage line is applied to the first electrode 123. For liquid crystal device embodiments, a common voltage may be applied to the first electrode 123 through the storage line. For organic light emitting display device embodiments, common voltage may not be used.

In one embodiment, the dielectric material 1222b of the capacitor C may have a first insulating layer 122a and a second insulating layer 122b stacked. The third insulating layer 122c of the gate insulating material 1222a of the thin film transistor TFT, is removed to form the capacitor C.

Since the first insulating layer 122a and the second insulating layer 122b include silicon nitride and silicon oxide, respectively, the dielectric material 1222b has a structure with the silicon nitride and the silicon oxide stacked.

In such embodiments, when the ratio T2/T1 of the thickness of the second insulating layer 122b to the thickness T1 of the first insulating layer 122a is less than about 0.1, the thickness of the second insulating layer 122b is relatively small, such that thickness uniformity of the second insulating layer 122b that is formed by chemical vapor deposition decreases, and the thickness of the silicon oxide is small, such that it is impossible to effectively prevent static electricity that may be produced between the first electrode 123 and the second electrode 129. On the other hand, when the ratio T2/T1 of the thickness T2 of the second insulating layer 122b to the thickness T1 of the first insulating layer 122a including the silicon oxide is above about 1.5, the thickness T1 of the first insulating layer 122a is relatively high, such that it is difficult to sufficiently increase the capacitance that can be increased by using nitride.

In some embodiments, the ratio T2/T1 of the thickness T2 of the second insulating layer 122b to the thickness T1 of the first insulating layer 122a may be about 0.1 to about 1.5. In one embodiment, the thicknesses T1 and T2 of the first insulating layer 122a and the second insulating layer 122b may be about 400 Å, about 400 Å, respectively. In another embodiment, the thickness T1 of the first insulating layer 122a may be about 800 Å to about 1000 Å and the thickness T2 of the second insulating layer 122b may be about 200 Å.

Some embodiments reduce the distance between the first electrode 123 and the second electrode 129 and the capacitance of the capacitor, by implementing the dielectric material 1222b of the capacitor C, by removing the third insulating layer 122c that occupies a predetermined thickness of the gate insulating material 1222a formed in the second region.

Accordingly, when the capacitor C is implemented by the storage capacitor Cst provided in the pixel, it is possible to reduce the areas of the first and second electrodes 123 and 129 with the increase of capacitance, such that it is possible to ensure the capacitance of the storage capacitor while achieving a high aperture ratio.

In the embodiment shown in FIG. 4, the first region where the thin film transistor TFT is formed and the second region where the capacitor C is formed are stepped with a thickness d of the third insulating layer 122c, as shown in FIG. 4, because the third insulating layer 122c is removed in the second region, such that it is possible to increase the capacitance of the capacitor while increasing the insulation effect of the thin film transistor.

Figure 5:
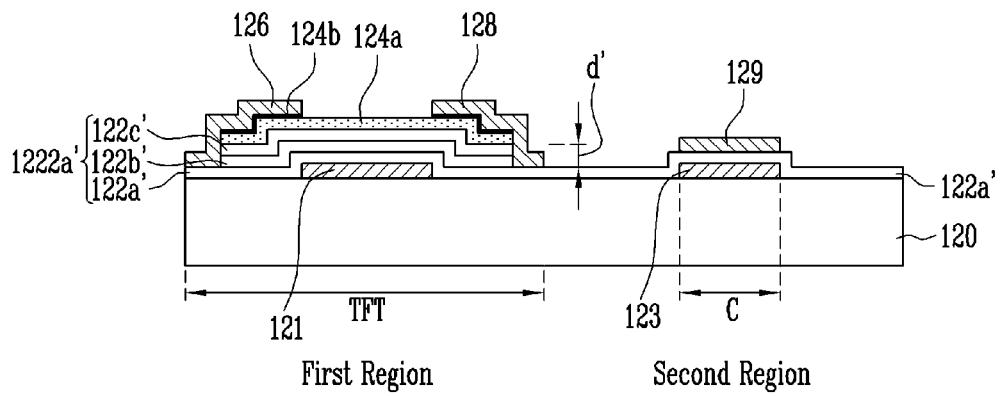
FIG. 5 is a cross-sectional view of another embodiment of a display device.

FIG. 5 is a cross-sectional view of another embodiment of a display device. The embodiment shown in FIG. 5 is substantially the same as the embodiment shown in FIG. 4, except that the dielectric material includes a first insulating layer 122a' including silicon nitride in the second region where the capacitor C is formed. Therefore, the same components are designated by the same reference numerals and the detailed descriptions thereof are not repeated.

Referring to FIG. 5, the display device includes a first substrate 120, and a thin film transistor TFT formed in the first region and a capacitor C formed in the second region on the first substrate 120.

In this embodiment, the structure of the thin film transistor TFT is substantially the same as that of the embodiment shown in FIG. 4. In the capacitor C, the first electrode 123 and the second electrode 129 face each other, with the dielectric material 122a' therebetween.

The dielectric material 122a' includes a single layer, the first insulating layer 122a'. Comparing with the gate insulating material 1222a' of the thin film transistor TFT, is the capacitor C is implemented with the second and third insulating layers 122b' and 122c' removed. In one embodiment, the thickness of the dielectric material 122a' may be about 800 Å to 1000 Å. In another embodiment, the thickness of the dielectric material may be about 200 Å.

In some embodiments, the distance between the first electrode 123 and the second electrode 129 is reduced by implementing the dielectric material 122a' of the capacitor with silicon nitride having a high dielectric constant. Accordingly, it is possible to increase the capacitance of the capacitor.

When the capacitor is implemented by the storage capacitor Cst provided in the pixel, it is possible to reduce the areas of the first and second electrodes 123 and 129 with the increase of capacitance, such that it is possible to ensure the capacitance of the storage capacitor while achieving a high aperture ratio.

According to the embodiment shown in FIG. 5, the first region where the thin film transistor TFT is formed, and the second region where the capacitor C is formed. The capacitor is formed by removing the second and third insulating layers 122b' and 122c' in the second region. Therefore, the structure having a step with a thickness of the second and third insulating layers 122b' and 122c' is implemented, as shown in FIG. 5. As a result, it is possible to improve the capacitance of the capacitor while increasing the insulation effect of the thin film transistor TFT.

Figure 6:
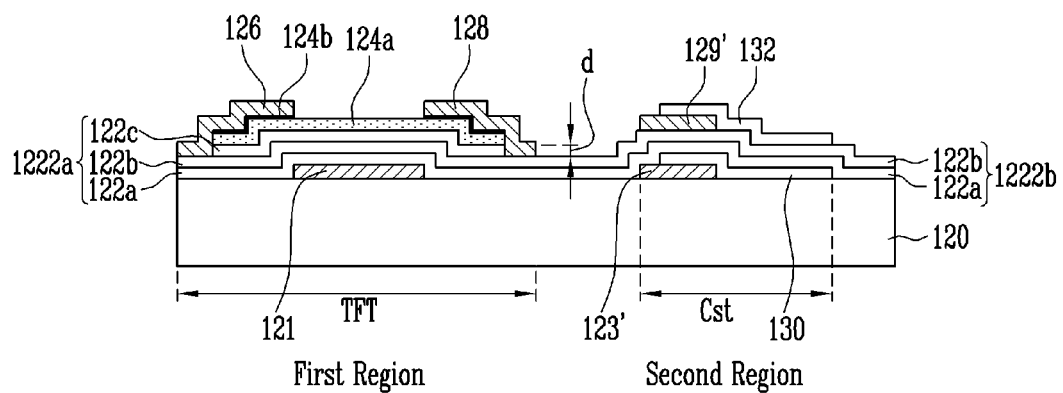
FIG. 6 is a cross-sectional view of another embodiment of a display device.

FIG. 6 is a cross-sectional view of another embodiment of a display device. The embodiment shown in FIG. 6 is substantially the same as the embodiment shown in FIG. 4, except that transparent conductive electrodes electrically connected with the first electrode 123' and the second electrode 129', respectively, are formed in the second region where the capacitor is formed. Therefore, the same components are designated by the same reference numerals and the detailed descriptions thereof are not repeated.

As shown in FIG. 6, first and second transparent conductive layers 130 and 132 electrically connected with the first and second electrodes 123' and 129' of the capacitor, respectively, are formed.

The first and second electrodes 123' and 129' include opaque metal. Therefore, the transmissive region of the display device decreases and the aperture ratio may be reduced. In order to prevent the reduction of the aperture ratio, in the embodiment shown in FIG. 6, the capacitance is increased by minimizing the areas of the first and second electrodes 123' and 129', and increasing the areas of the first and second transparent conductive layers 130 and 132 electrically connected with the first and second electrodes 123' and 129', respectively.

The first and second transparent conductive layers 130 and 132 may include transparent conductive materials, such as ITO (indium Tin Oxide), TO (Tin Oxide), IZO (Indium Zinc Oxide), ITZO (Indium Tin Zinc Oxide).

As shown in FIG. 6, the first and second transparent conductive layers 130 and 132 may be implemented to partially overlap the upper portion of the ends of the first and second electrodes 123' and 129'. In other embodiments, the first and second transparent conductive layers 130 and 132 may be implemented to completely cover the first and second electrodes 123' and 129'. In other embodiments, the first and second transparent conductive layers 130 and 132 may be formed in the transmissive region of each pixel, and the first and second electrodes 123' and 129' may be positioned above the first and second transparent conductive layers 130 and 132.

Figure 7:
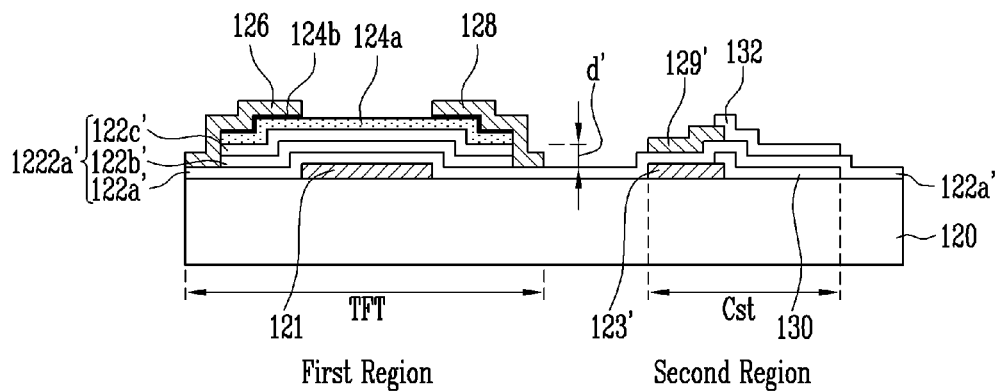
FIG. 7 is a cross-sectional view of another embodiment of a display device.

FIG. 7 is a cross-sectional view of another embodiment of a display device.

The embodiment shown in FIG. 7 is substantially the same as the embodiment shown in FIG. 5, except that transparent conductive layers 130 and 132 electrically connected with the first electrode 123' and the second electrode 129', respectively, are formed in the second region where the capacitor is formed. Therefore, the same components are designated by the same reference numerals and the detailed descriptions thereof are not repeated.

As shown in FIG. 7, the first and second transparent conductive layers 130 and 132 electrically connected with the first and second electrodes 123' and 129' of the capacitor are formed.

Comparing with the embodiment of FIG. 6, the embodiment of FIG. 7 has a single structure of the first insulating layer 122a' in which the dielectric material formed between the first and second electrodes 123' and 129' is implemented by silicon nitride, and the object of additionally forming the first and second transparent conductive layers 130 and 132 is the same as in the embodiment of FIG. 6.

Figure 8:
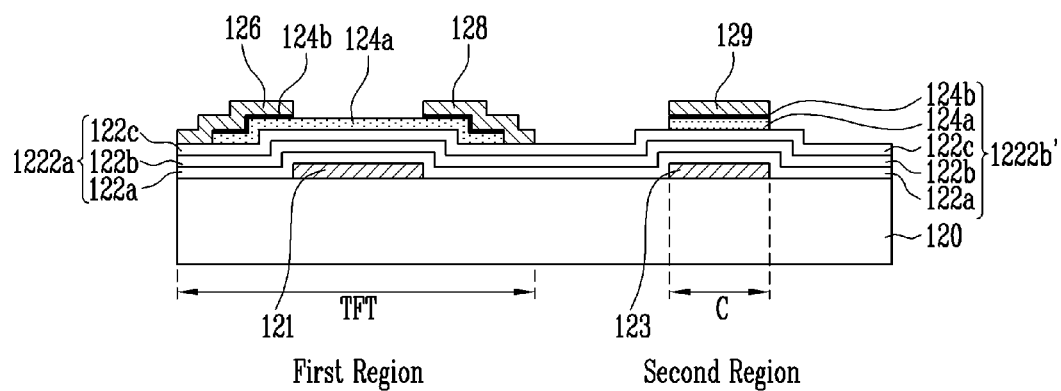
FIG. 8 is a cross-sectional view of another embodiment of a display device.

FIG. 8 is a cross-sectional view of another embodiment of a display device.

The embodiment shown in FIG. 8 is substantially the same as the embodiment shown in FIG. 4, except that the dielectric material 1222b' is implemented by five layers, the gate insulating material 1222a, which is implemented by the first to third insulating layers 122a, 122b, and 122c, the active layer 124a, and the resistive contact layer 124b in. Therefore, the same components are designated by the same reference numerals and the detailed descriptions thereof are not repeated.

In the embodiment of FIG. 8, in the capacitor C formed in the second region the first electrode 123 and the second electrode 129 overlap each other, with the dielectric material 1222b' therebetween.

The dielectric material 1222b', as described above, further includes the active layer 124a and the resistive layer 124b above the gate insulating material 1222a, as compared with the gate insulating material 1222a of the thin film transistor TFT.

Embodiments of a Fabrication Method of Embodiments of the Display Device

FIGS. 9 to 12 are cross-sectional views illustrating embodiments of a fabrication method of the embodiments of the display device.

FIGS. 9A to 9D are cross-sectional views illustrating an embodiment of a fabrication method of the embodiment of a display device shown in FIG. 4.

Figure 9A:
FIGS. 9A to 9D are cross-sectional views illustrating an embodiment of a fabrication method of the embodiment of a display device shown in FIG. 4.

Referring to FIG. 9A, the gate electrode 121 is formed in the first region on the first substrate 120 where the thin film transistor TFT is formed. Further, the first electrode 123 is formed in the second region which is positioned adjacent to the first region and where the capacitor C is formed.

The gate electrode 121 and the first electrode 123 may include a conductive material. The conductive material may be, for example, metal, such as chrome, aluminum, tantalum, molybdenum, titanium, tungsten, copper, and silver, and the like, and alloys of the metals. The gate electrode 121 and the first electrode 123 may be formed in a single layer. In other embodiments, the gate electrode 121 and the first electrode 123 may include two or more layers having different physical properties.

A conductive layer including a conductive material is formed on the first substrate 120 by sputtering and deposition, such as a physical-chemical vapor deposition. Thereafter, the gate electrode 121 and the first electrode 123 are formed on the conductive layer by patterning, such as photolithography.

Figure 9B:
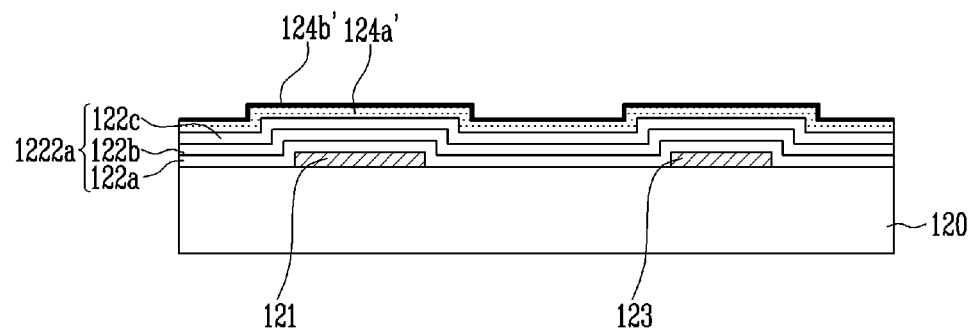

Referring to FIG. 9B, a gate insulating material 1222a, an amorphous silicon layer 124a', and an amorphous silicon layer 124b' doped with a dopant may be sequentially formed on the first substrate 120 where the gate electrode 121 and the first electrode 123 are formed.

In some embodiments, the gate electrode 1222a may include the first to third insulating layers 122a, 122b, and 122c. The first to third insulating layers 122a and 122c may include silicon nitride. The second insulating layer 122b formed between the first to third insulating layers 122a and 122c may include silicon oxide.

In some embodiments, the ratio T2/T1 of the thickness T2 of the second insulating layer 122b to the thickness T1 of the first insulating layer 122a may be about 0.1 to about 1.5, and the ratio T3/T2 of the thickness T3 of the third insulating layer 122c to the thickness T2 of the second insulating layer 122b may be about 2 to about 12. These thickness ratios are, as described above, determined in consideration of BV characteristics, static electricity characteristics, thickness uniformity characteristics, capacitance.

Figure 9C:
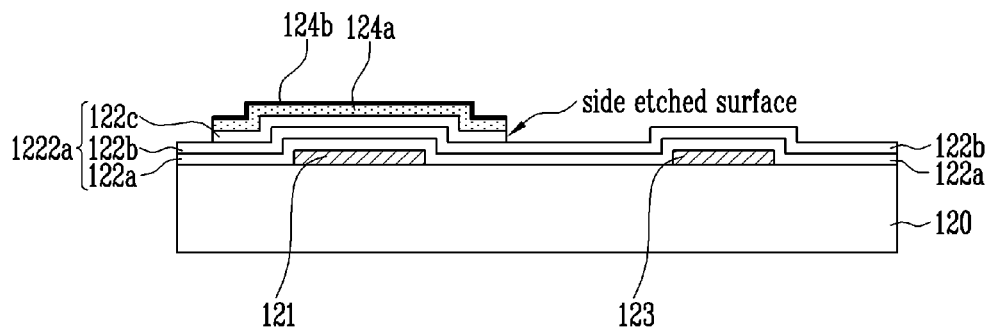

Referring to FIG. 9C, an amorphous silicon layer 124a' and a doped amorphous silicon layer 124b' formed in the first region are changed into the active layer 124a and the resistive contact layer 124b by patterning, such as photolithography.

The third insulating layer 122c formed in the second region may be removed when the amorphous silicon layer 124a' and the doped amorphous silicon layer 124b' are patterned. In some embodiments, the third insulating layer 122c included in the gate insulating material 1222a may have a side etched surface, which is substantially the same as the active layer 124a. In other embodiments, it may be removed by a specific etching.

In some embodiments, the third insulating layer 122c and the second insulating layer 122b may include insulating layers having different etching selectivities. In one embodiment, the third insulating layer 122c and the second insulating layer 122b may include silicon nitride and silicon oxide, respectively.

With the second insulating layer 122b and the third insulating layer 122c having different etching selectivities, the second insulating layer 122b may be used an anti-etching layer, when the third insulating layer 122c formed in the second region is removed.

In one embodiment, the etching selectivity of the second insulating layer 122b including silicon nitride and the third insulating layer 122c including silicon oxide is about 1:20 and about 1:8, respectively, which are relatively high. Therefore, the third insulating layer 122c can be sufficiently used as the anti-etching layer in the etching process of the second insulating layer 122b.

Figure 9D:
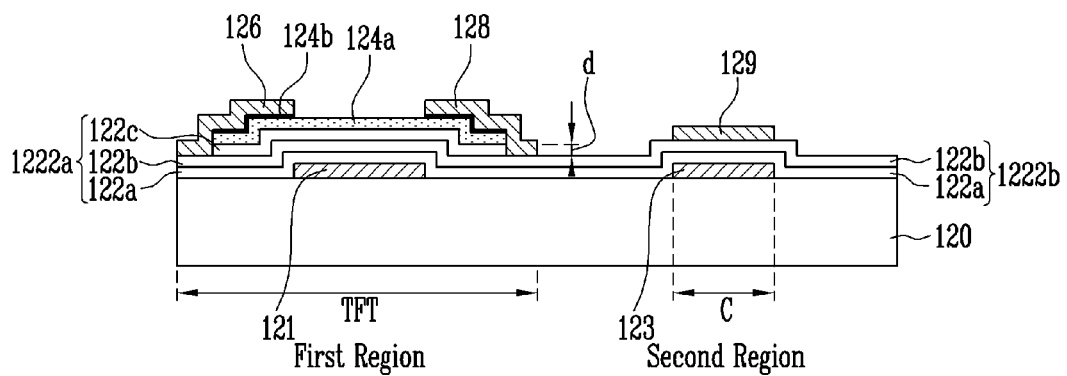

Referring to FIG. 9D, the source and drain electrodes 126 and 128 contacting the resistive contact layer 124b are formed above the active layer 124a and the resistive contact layer 124b of the first region. The second electrode 129 is formed on the second insulating layer 122b overlapping the first electrode 123 in the second region. The source electrode 126, the drain electrode 128, and the second electrode 129 may be formed by sputtering and deposition, such as chemical vapor deposition.

When the source electrode 126, the drain electrode 128, and the second electrode 129 include metal, such as molybdenum (Mo) and molybdenum tungsten (MoW), a conductive layer is formed by sputtering. Thereafter, the source electrode 126, the drain electrode 128, and the second electrode 129 may be formed by patterning the conductive layer. In this process, the resistive contact layer 124b exposed between the source electrode 126 and the drain electrode 128 may be removed such that the active layer 124a is exposed.

In some embodiments, one or both of the source and drain electrodes 126 and 128 may contact the second insulating layer 122b. In other embodiments, the source and drain electrodes 126 and 128 may be formed above only the active layer 124a. In such embodiments, the first to third insulating layers 122a, 122b, and 122c, the active layer 124a, and the resistive contact layer 124b are positioned between the gate electrode 121 and the source and drain electrodes 126 and 128. Therefore, it is possible to minimize the parasitic capacitance effect due to the gate electrode 121 and the source and drain electrodes 126 and 128.

In some embodiments, the dielectric material 1222b implements a capacitor by including only the second insulating layer 122b and the first insulating layer 122a, in the second region, such that it is possible to reduce the distance between the first electrode 123 and the second electrode 129, and accordingly, it is possible to increase capacitance of the capacitor. Therefore, it is possible to increase the capacitance of the capacitor C including the dielectric capacitor C. As a result, when the areas of the first and second electrodes 121 and 129 can be reduced with the increase of the capacitance, it is possible to ensure the capacitance of the storage capacitor while achieving a high aperture ratio.

According to the embodiment shown in FIG. 9, the third insulating layer 122c is removed from the second region. Therefore, as shown in FIG. 9D, the first region and the second region are stepped as much as the thickness d of the third insulating layer 122c. Accordingly, it is possible to improve the capacitance of the capacitor while increasing the insulation effect of the thin film transistor.

FIGS. 10A to 10D are cross-sectional view illustrating an embodiment of a fabrication method of the embodiment of a display device shown in FIG. 5.

The embodiment shown in FIG. 10 is substantially the same as the embodiment shown in FIG. 9, except that not only the third insulating layer, but the second insulating layer is also removed from the second region where the capacitor is formed, such that the dielectric material formed between the first and second electrodes includes only the first insulating layer. Therefore, the same components are designated by the same reference numerals and the detailed descriptions thereof are not repeated.

Figure 10A:
FIGS. 10A to 10D are cross-sectional view illustrating an embodiment of a fabrication method of the embodiment of a display device shown in FIG. 5.
Figure 10B:
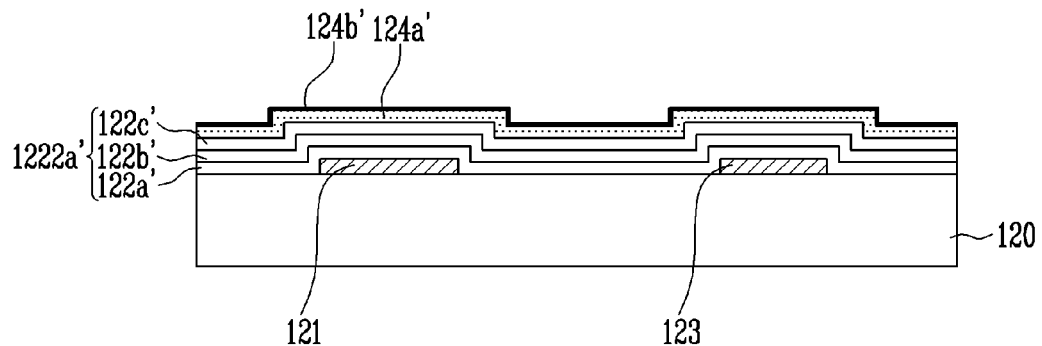

FIG. 10B illustrates the same as the process of FIG. 10A. The gate electrode 121 is formed in the first region on the first substrate 120 where the thin film transistor TFT is formed. Further, the first electrode 123 is formed in the second region which is positioned adjacent to the first region and where the capacitor C is formed.

Referring to FIG. 10B, the first insulating layer 122a', the second insulating layer 122b', the third insulating layer 122c', the amorphous silicon layer 124a', and the doped amorphous silicon layer 124b' are sequentially formed on the first substrate 120 including the gate electrode 121 and the first electrode 123. The thickness ratios between the first insulating layer 122a', the second insulating layer 122b', and the third insulating layer 122c' is as was described with reference to FIG. 9.

Figure 10C:
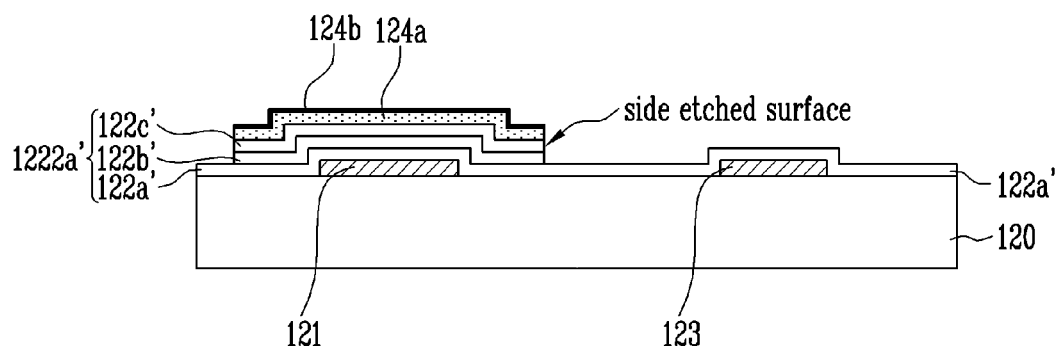

Referring to FIG. 10C, an amorphous silicon layer 124a' and a doped amorphous silicon layer 124b' formed in the first region are changed into the active layer 124a and the resistive contact layer 124b by patterning, such as photolithography. The second insulating layer 122b' and the third insulating layer 122c' formed in the second region may be removed in the patterning. In some embodiments, the second insulating layer 122b' and the third insulating layer 122c' included in the gate insulating material 1222a' may have a side etched surface, which may be substantially the same as the active layer 124a. In other embodiments, the second insulating layer 122b' and the third insulating layer 122c' formed in the second region may also be removed by specific etching.

The second insulating layer 122b' and the first insulating layer 122a' may include insulating materials having different etching selectivities. In one embodiment, the second insulating layer 122b' and the first insulating layer 122a' may include silicon oxide and silicon nitride, respectively.

The etching selection ratios of the second insulating layer 122b' including silicon oxide and the first insulating layer 122a' including silicon nitride are about 1:20 and about 1:8, respectively, which are relatively high. Therefore, the first insulating layer 122a' may be used as an anti-etching layer when the second insulating layer 122b' positioned in the second region is removed. Therefore, it is possible to sufficiently remove the second insulating layer 122b' and effectively protect the components under the first insulating layer 122a'.

Figure 10D:
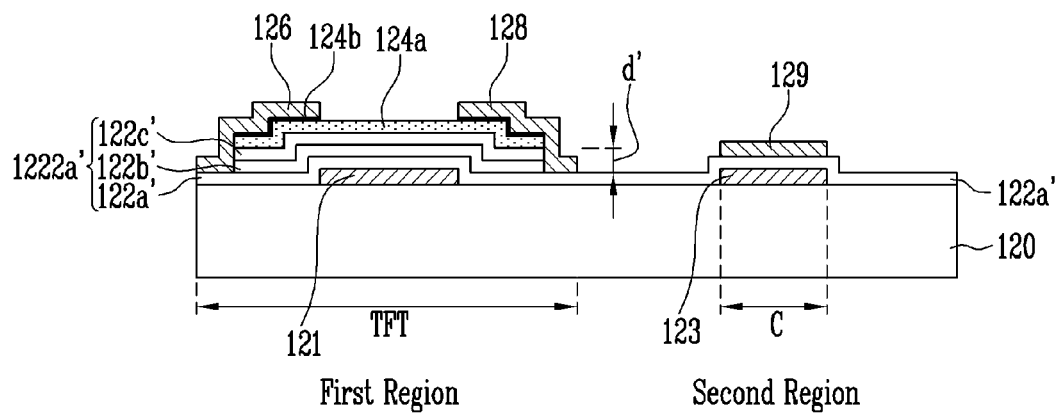

Referring to FIG. 10D, the source and drain electrodes 126 and 128 contacting the resistive contact layer 124b are formed in the first region where the active layer 124a is formed. The second electrode 129 is formed on the first insulating layer 122a' overlapping the first electrode 123 in the second region.

As shown in the embodiment of FIG. 10D, at least one of the source and drain electrodes 126 and 128 may contact the first insulating layer 122a'. In other embodiments, the source and drain electrodes 126 and 128 may be positioned above only the active layer 124a. In such embodiments, the parasitic capacitance may be reduced.

FIGS. 11A to 11F are cross-sectional view illustrating an embodiment of a fabrication method of the embodiment of a display device shown in FIG. 6.

The embodiment shown in FIG. 11 is substantially the same as the embodiment shown in FIG. 9, except that transparent conductive electrodes electrically connected with the first electrode and the second electrode, respectively, are formed in the second region where the capacitor is formed. Therefore, the same components are designated by the same reference numerals and the detailed descriptions thereof are not repeated.

Figure 11A:
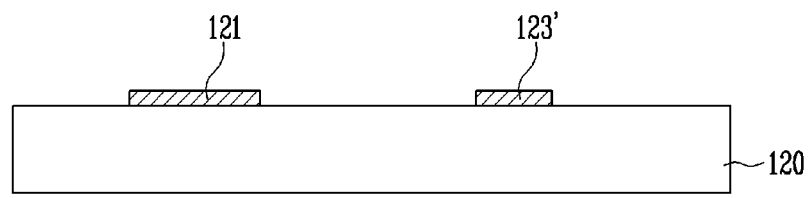
FIGS. 11A to 11F are cross-sectional view illustrating an embodiment of a fabrication method of the embodiment of a display device shown in FIG. 6.
Figure 11B:
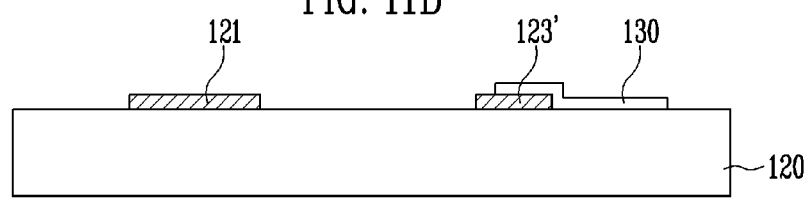
Figure 11C:
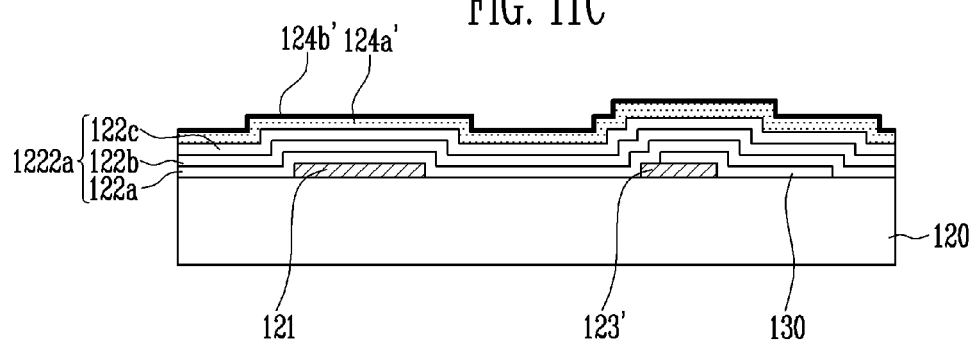
Figure 11D:
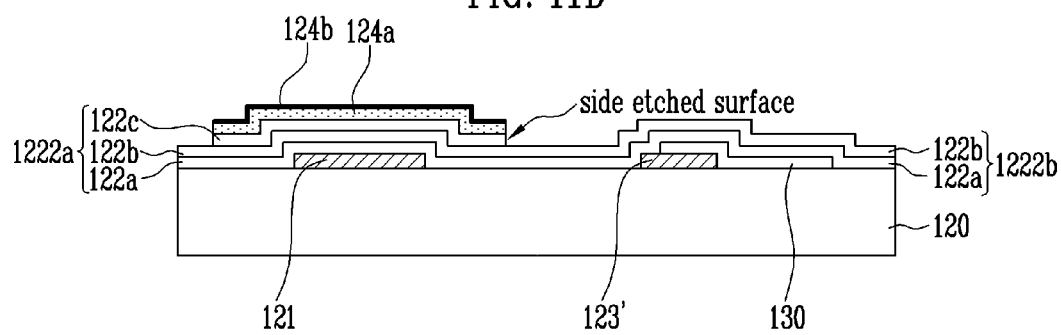
Figure 11E:
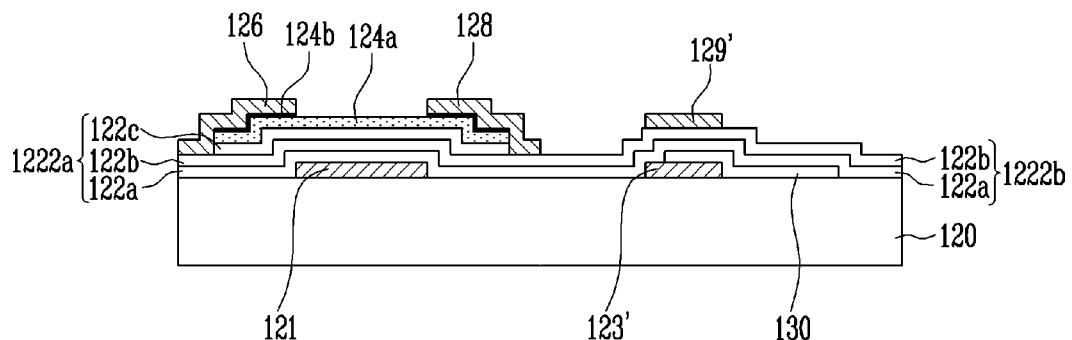

The processes illustrated in FIGS. 11A, 11B, and 11C are substantially the same as those illustrated in FIGS. 9A, 9B, 9C, and 9D. However, a first transparent conductive layer 130 electrically connected with the first electrode 123' and a second transparent conductive layer 132 electrically connected with the second electrode 129' are further formed in the embodiment of FIG. 11.

The embodiment of the display device shown in FIG. 6 may help prevent the aperture ratio from being reduced by reduction of the transparent region of the display device, which is a disadvantage caused when the first and second electrodes 121' and 129' are implemented by opaque metal.

Figure 11F:
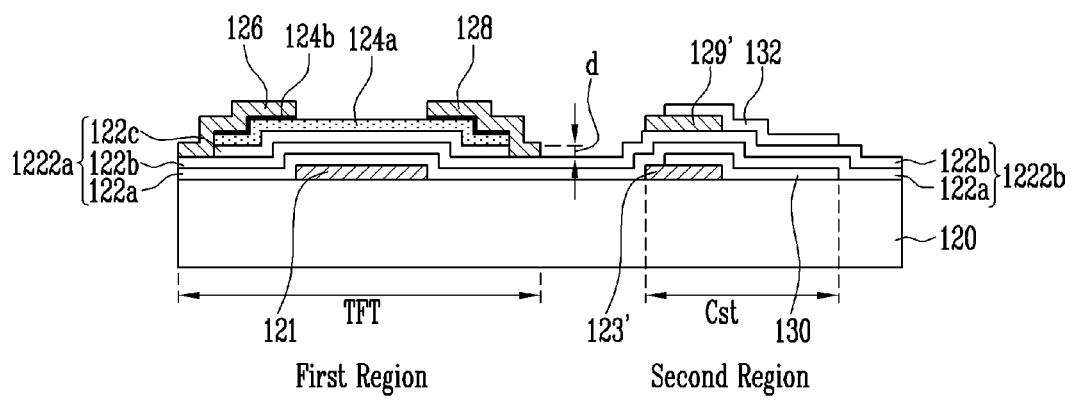

Adding the processes of FIGS. 11B and 11F minimizes the areas of the first and second electrodes 121' and 129'. It is also possible to prevent reduction of the aperture ratio, while ensuring capacitance, by increasing the areas of the first and second transparent conductive layers 130 and 132 connected with the first and second electrodes 121' and 129', respectively.

In some embodiments, the transparent conductive materials included in the first and second transparent conductive layers 130 and 132 may include ITO (indium Tin Oxide), TO (Tin Oxide), IZO (Indium Zinc Oxide), ITZO (Indium Tin Zinc Oxide).

In some embodiments, the first and second transparent conductive layers 130 and 132 partially overlap the upper portions of the ends of the first and second electrodes 123' and 129', respectively.

In other embodiments, the first and second transparent conductive layers 130 and 132 may be implemented to completely cover the first and second electrodes 123' and 129', or the first and second transparent electrodes 130 and 132 may be formed on the transmissive region of each pixel and the first and second electrodes 123' and 129' may be formed in one region above the transparent conductive layers.

FIGS. 12A to 12F are cross-sectional view illustrating an embodiment of a fabrication method of the embodiment of a display device shown in FIG. 7.

The embodiment shown in FIG. 12 is different from the embodiment shown in FIG. 10 in that in the second region where the capacitor is formed, further forming transparent conductive electrodes electrically connected with the first and second electrodes, respectively, is included; therefore, the same components are designated by the same reference numerals and the detailed descriptions thereof are not repeated.

The processes illustrated in FIGS. 12A, 12C, 12D, and 12E are substantially the same as those illustrated in FIGS. 10A, 10B, 10C, and 10D, respectively.

The embodiment of FIG. 12 further includes forming the first transparent conductive layer 130 electrically connected with the first electrode 123' formed in the second region (as described in reference to FIG. 11B) and forming the second transparent conductive layer 132 electrically connected with the second electrode 129' (as described in reference to FIG. 11F).

Figure 12A:
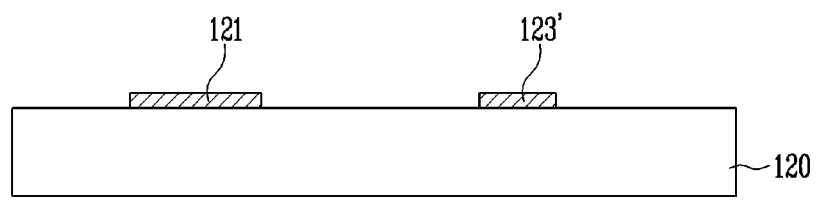
FIGS. 12A to 12F are cross-sectional view illustrating an embodiment of a fabrication method of the embodiment of a display device shown in FIG. 7.
Figure 12B:
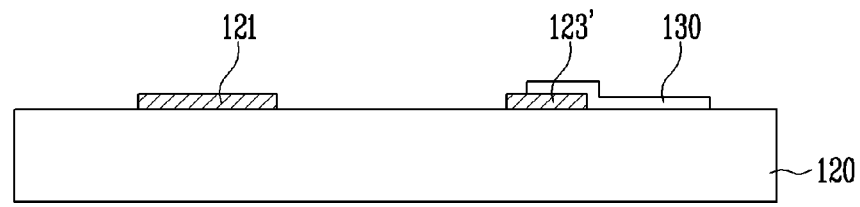
Figure 12C:
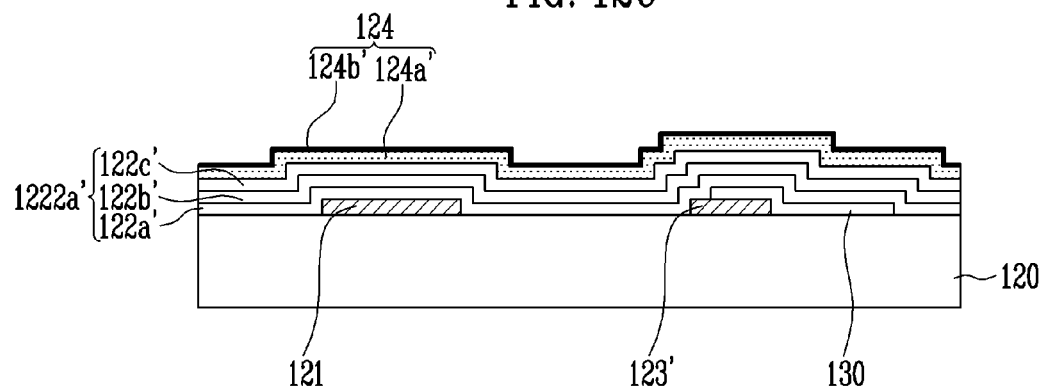
Figure 12D:
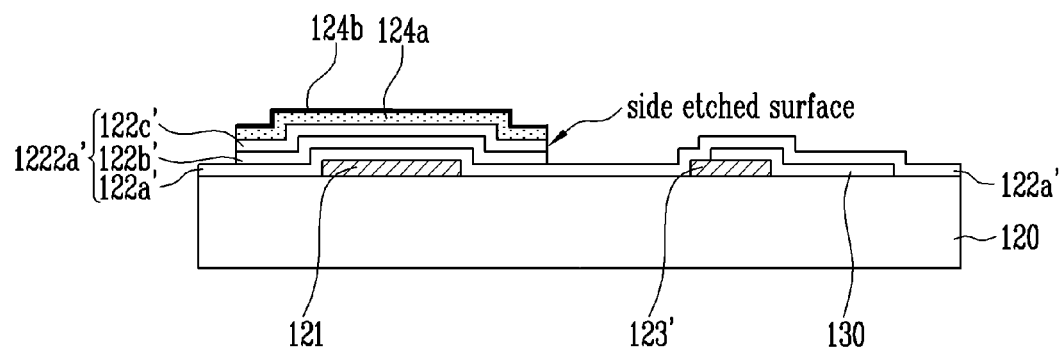
Figure 12E:
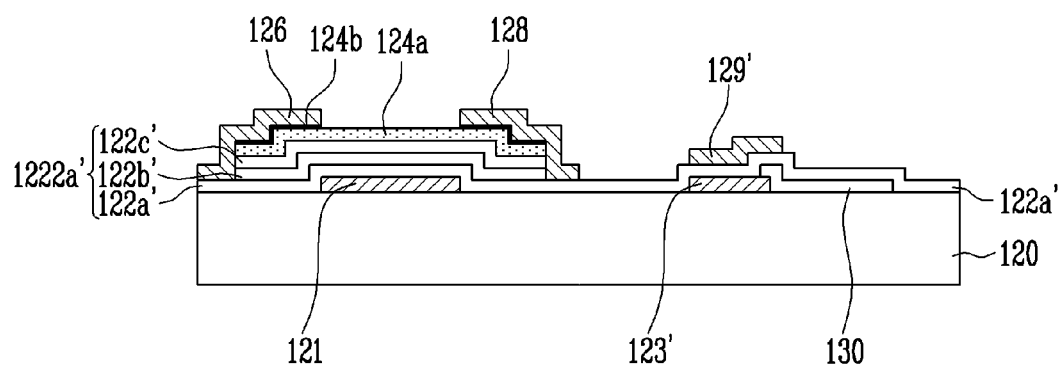
Figure 12F:
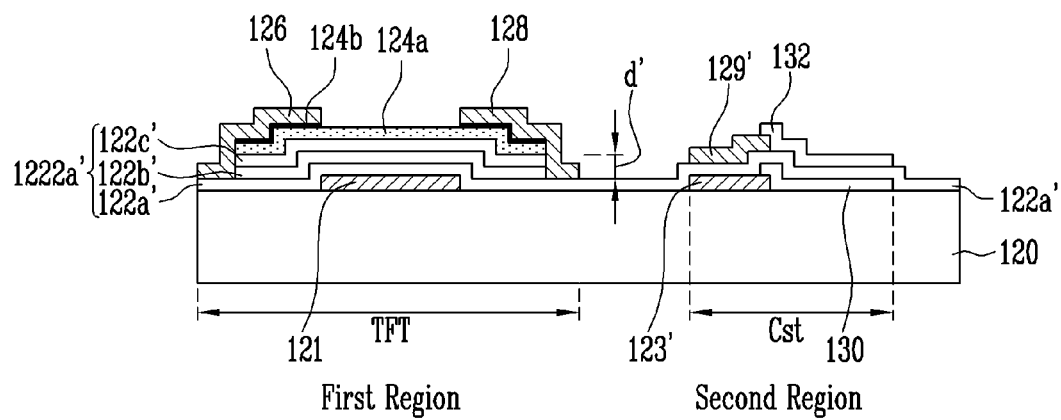

By adding the processes of FIGS. 12B and 12F, it is possible to minimize the areas of the first and second electrodes 123' and 129', and it is possible to prevent reduction of the aperture ratio, while ensuring capacitance by increasing the areas of the first and second transparent conductive layers 130 and 132 connected with the first and second electrodes 123' and 129', respectively.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A display device comprising a thin film transistor, which comprises:
    an active layer;
    a gate electrode;
    a source electrode electrically connected to the active layer;
    a drain electrode electrically connected to the active layer; and
    a gate insulating material formed between the active layer and the gate electrode, wherein the gate insulating material comprises a first layer, a second layer and a third layer;
    wherein the second layer has a thickness between about 0.1 to about 1.5 times a thickness of the first layer;
    wherein the third layer has a thickness between about 2 to about 12 times the thickness of the second layer, and
    wherein at least one of the source electrode or the drain electrode contacts the second layer.

2. The display device of claim 1, wherein the etching selectivity between the third layer and the second layer is about 1:20 to about 1:8, and the etching selectivity between the second layer and the first layer is about 1:20 to about 1:8.

3. The display device of claim 1, wherein the first layer and the second layer are formed of different materials than one another such that a response to an etchant is faster for the second layer than the first layer.

4. The display device of claim 1, wherein the second layer and the third layer are formed of different materials than one another such that a response to an etchant is faster for the third layer than the second layer.

5. The display device of claim 2, wherein the third layer and the first layer each comprise silicon nitride, and the second layer comprises silicon oxide.

6. The display device of claim 1, wherein the active layer and the third layer have the same side etched surface.

7. The display device of claim 1, further comprising a capacitor, which comprises:
    a first electrode;
    a second electrode; and
    a dielectric material positioned between the first electrode and the second electrode.

8. The display device of claim 7, wherein the first electrode and the gate electrode are formed of the same material and from the same processing.

9. The display device of claim 7, wherein the second electrode, the source electrode and the drain electrode are formed of the same material and from the same processing.

10. The display device of claim 7, wherein the first layer and the second layer of the gate insulating material extend to the capacitor to provide the dielectric material.

11. The display device of claim 7, wherein the dielectric material comprises only one layer, and wherein the first layer of the gate insulating material extends to the capacitor to provide the dielectric material.

12. The display device of claim 7, wherein the first, the second and the third layers of the gate insulating material, and the active layer extend to the capacitor to provide the dielectric material.

13. The display device of claim 7, wherein the capacitor further comprises:
    a first transparent conductive layer connected with the first electrode; and
    a second transparent conductive layer connected with the second electrode.

14. A display device comprising a thin film transistor, which comprises:
    an active layer;
    a gate electrode;
    a source electrode electrically connected to the active layer;
    a drain electrode electrically connected to the active layer; and
    a gate insulating material formed between the active layer and the gate electrode, wherein the gate insulating material comprises a first layer, a second layer and a third layer;
    wherein the second layer has a thickness between about 0.1 to about 1.5 times a thickness of the first layer,
    wherein the third layer has a thickness between about 2 to 12 times the thickness of the second layer, and
    wherein at least any one of the source electrode and the drain electrode contacts the first layer.

15. The display device of claim 14, wherein the active layer, the third layer, and the second layer have the same side etched surface.

16. The display device of claim 14, further comprising a capacitor, which comprises:
    a first electrode;
    a second electrode; and
    a dielectric material positioned between the first electrode and the second electrode.

17. The display device of claim 16, wherein the first electrode and the gate electrode are formed of the same material and from the same processing.

18. The display device of claim 16, wherein the second electrode, the source electrode and the drain electrode are formed of the same material and from the same processing.

19. The display device of claim 16, wherein the first layer and the second layer of the gate insulating material extend to the capacitor to provide the dielectric material.

20. A display device, comprising:
    a thin film transistor positioned over a substrate; and
    a capacitor positioned over the substrate;
    wherein the thin film transistor comprises:
        an active layer,
        a gate electrode,
        a source electrode electrically connected to the active layer,
        a drain electrode electrically connected to the active layer, and
        a gate insulating material formed between the active layer and the gate electrode, wherein the gate insulating material comprises a first layer, a second layer and a third layer;

wherein the capacitor comprises:
a first electrode,
a second electrode, and
a dielectric material positioned between the first electrode and the second electrode, wherein the dielectric material comprises less layers than the gate insulating material.

21. The display device of claim 20, wherein the dielectric material comprises the active layer and the third layer.

22. The display device of claim 20, wherein the dielectric material comprises the active layer, the third layer, and the second layer.

23. The display device of claim 20, wherein the second layer has a thickness between about 0.1 to about 1.5 times a thickness of the first layer; and wherein the third layer has a thickness between about 2 to about 12 times the thickness of the second layer.

* * * * *